(12) United States Patent
Lee et al.

(10) Patent No.: US 8,685,263 B2
(45) Date of Patent: Apr. 1, 2014

(54) METHOD OF FABRICATING CLICHE

(75) Inventors: Jun-Hee Lee, Incheon (KR);
Jeong-Hoon Lee, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 10 days.

(21) Appl. No.: 13/555,316

(22) Filed: Jul. 23, 2012

(65) Prior Publication Data
US 2013/0032569 A1      Feb. 7, 2013

(30) Foreign Application Priority Data

Aug. 3, 2011   (KR) .......................... 10-2011-0077190

(51) Int. Cl.
*B44C 1/22*   (2006.01)

(52) U.S. Cl.
USPC .................. 216/39; 216/47; 216/51

(58) Field of Classification Search
None
See application file for complete search history.

(56) References Cited

U.S. PATENT DOCUMENTS

| | | | |
|---|---|---|---|
| 5,246,531 A * | 9/1993 | Junji et al. | 216/47 |
| 2005/0202350 A1* | 9/2005 | Colburn et al. | 430/320 |
| 2011/0132527 A1* | 6/2011 | Kook et al. | 156/219 |

* cited by examiner

*Primary Examiner* — Allan Olsen
(74) *Attorney, Agent, or Firm* — Morgan, Lewis & Bockius LLP

(57) ABSTRACT

Disclosed herein is a method of fabricating a cliché capable of preventing a printing roller from touching a bottom surface of the cliché. The method of fabricating the cliché includes forming a mask thin film pattern having a multilayer structure and a photoresist pattern on a base substrate, forming a resistant reinforcement inducing layer to cover the photoresist pattern, thereby transforming the photoresist pattern into a resistant reinforced photoresist pattern, and forming groove patterns having different depths from each other by etching the base substrate using the resistant reinforced photoresist pattern and the mask thin film pattern having the multilayer structure as masks.

6 Claims, 9 Drawing Sheets

<RELATED ART>

<PRESENT INVENTION>

METHOD OF FABRICATING CLICHE

This application claims the benefit of Korean Patent Application No. P2011-0077190, filed on Aug. 3, 2011, which is hereby incorporated by reference as if fully set forth herein.

BACKGROUND OF THE INVENTION

1. Field of the Invention

The present invention relates to a method of fabricating a cliché capable of preventing a printing roller from touching a bottom surface of the cliché.

2. Discussion of the Related Art

Recently, a variety of Flat Panel Displays (FPDs) are receiving attention as devices with reduced weight and volume to overcome disadvantages of a Cathode Ray Tube (CRT). FPDs include, for example, Liquid Crystal Displays (LCDs), Field Emission Displays (FEDs), Plasma Display Panels (PDPs), Electro-Luminescent (EL) displays, etc.

Such an FPD consists of a plurality of thin films formed by a mask process, which includes a deposition (coating) process, an exposure process, a developing process, an etching process, and the like. However, the mask process has a problem in that fabricating processes are complicated, thereby increasing fabrication costs. Hence, studies into forming the thin film through a printing process using a printing roller are recently underway.

The printing process refers to a process of forming a desired thin film in such a manner that the printing roller is coated, at a blanket thereof, with printing liquid, is formed with a printing pattern using a cliché having a groove pattern and a protrusion pattern, and then transfers the printing pattern onto a substrate.

Here, when the groove pattern 12 of the cliché 10 has a lower depth than that to which the printing roller 20 is pressed, as shown in FIG. 1, the printing roller 20 touches a bottom surface of the groove pattern 12 of the cliché 10 (see "A"). Consequently, the printing liquid 22 coated on the printing roller 20 is transferred to the bottom surface of the groove pattern 12 of the cliché 10, thereby being lost. When such lost printing liquid is transferred onto the substrate, a non-thin film region of a pinhole form is generated at a thin film layer. When the thin film layer is, particularly, used as a black matrix or a color filter to realize colors, there is a problem of causing a poor pattern such as decolorization in which colors are invisible at the non-thin film region of the thin film layer. In addition, when the thin film layers are formed on the respective substrates of a plurality of panels using the cliché 10 with the bottom surface touching the printing roller 20, there is a problem in that the same defects are respectively generated at the same positions of all the substrates, thereby causing deterioration of yield.

SUMMARY OF THE INVENTION

Accordingly, the present invention is directed to a method of fabricating a cliché that substantially obviates one or more problems due to limitations and disadvantages of the related art.

An object of the present invention is to provide a method of fabricating a cliché capable of preventing a printing roller from touching a bottom surface of the cliché.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of fabricating a cliché includes forming a mask thin film pattern having a multilayer structure and a photoresist pattern on a base substrate, forming a resistant reinforcement inducing layer to cover the photoresist pattern thereby transforming the photoresist pattern into a resistant reinforced photoresist pattern, and forming groove patterns having different depths from each other by etching the base substrate using the resistant reinforced photoresist pattern and the mask thin film pattern having the multilayer structure as masks.

The resistant reinforcement inducing layer may be formed through a deposition process at room temperature and the resistant reinforcement inducing layer may be formed of a transparent conductive film including at least one of indium tin oxide (ITO), indium zinc oxide (IZO), and indium tin zinc oxide (ITZO). The forming the resistant reinforcement inducing layer may include introducing an energy generated during the deposition process of the resistant reinforcement inducing layer into the photoresist pattern under the resistant reinforcement inducing layer.

The forming the mask thin film pattern having the multilayer structure and the photoresist pattern may include forming a first mask thin film layer on the base substrate, forming a first photoresist pattern on the base substrate at which the first mask thin film layer is formed, patterning the first mask thin film layer as the first photoresist pattern so as to form a first mask thin film pattern, forming a second mask thin film layer on the base substrate at which the first mask thin film pattern is formed, forming a second photoresist pattern on the second mask thin film layer, and patterning the second mask thin film layer using the second photoresist pattern as a mask so as to form a second mask thin film pattern.

The resistant reinforcement inducing layer may be formed on the second photoresist pattern and the base substrate exposed by the second photoresist pattern.

The resistant reinforced second photoresist pattern may have acid resistance to etchant of the base substrate, and the etchant of the base substrate may include hydrogen fluoride (HF).

The forming the groove patterns having the different depths from each other may include primarily etching the base substrate through a wet etching process using the second photoresist pattern and the first and second mask thin film patterns as masks, thereby forming a long groove pattern and removing the resistant reinforcement inducing layer by the primary etching, removing the second photoresist pattern and the second mask thin film pattern, secondarily etching the base substrate through the wet etching process using the first mask thin film pattern as a mask, thereby forming a short groove pattern and allowing the long groove pattern to have a depth deeper than the short groove pattern, and removing the first mask thin film pattern.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
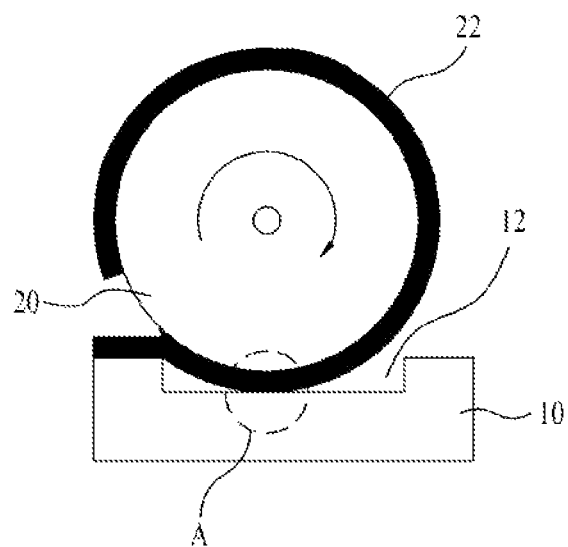
FIG. 1 is a sectional view illustrating a cliché of a printing device according to the related art.
Figure 2:
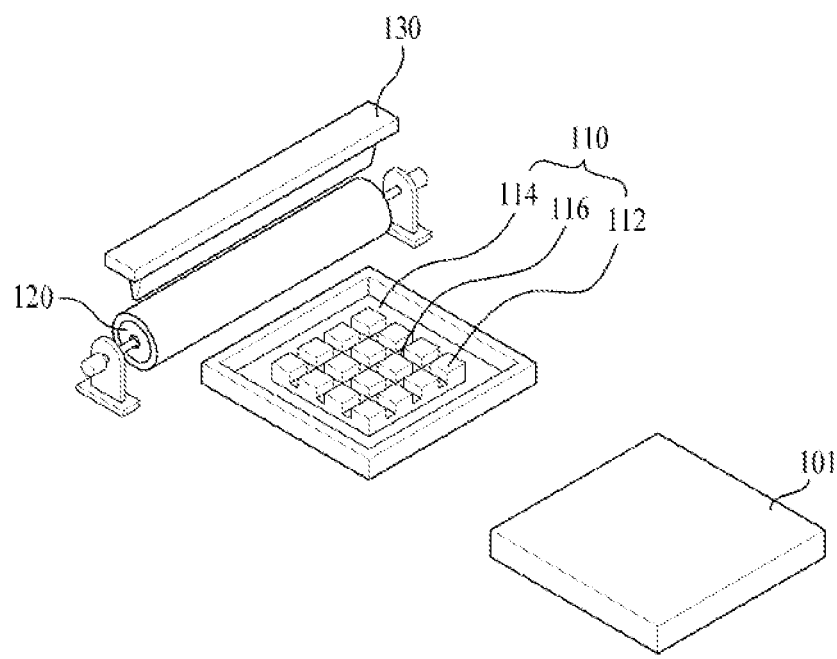
FIG. 2 is a perspective view illustrating a thin film pattern forming device including a cliché according to an embodiment of the present invention.

FIG. 2 is a perspective view illustrating a thin film pattern forming device according to an embodiment of the present invention.

The thin film pattern forming device shown in FIG. 2 includes a printing liquid supply portion 130, a printing roller 120, and a cliché 110.

The printing liquid supply portion 130 stores printing liquid of an organic or inorganic substance and supplies the stored printing liquid to a blanket of the printing roller 120.

In the printing roller 120, the printing liquid is applied from the printing liquid supply portion 130 to the blanket attached to an outer peripheral surface of the printing roller 120.

The printing roller 120 rotates on the cliché 110 and substrate 101 so as to sequentially come into contact with the same. That is, the printing roller 120 linearly moves along guide rails (not shown) located at opposite sides of a stage (not shown) at which the cliché 110 and substrate 101 are seated while rotating on the cliché 110 and substrate 101.

The cliché 110 comes into contact with the blanket of the printing roller 120 so that the printing liquid applied to the blanket of the printing roller 120 remains only at a required region thereof.

Figure 3:
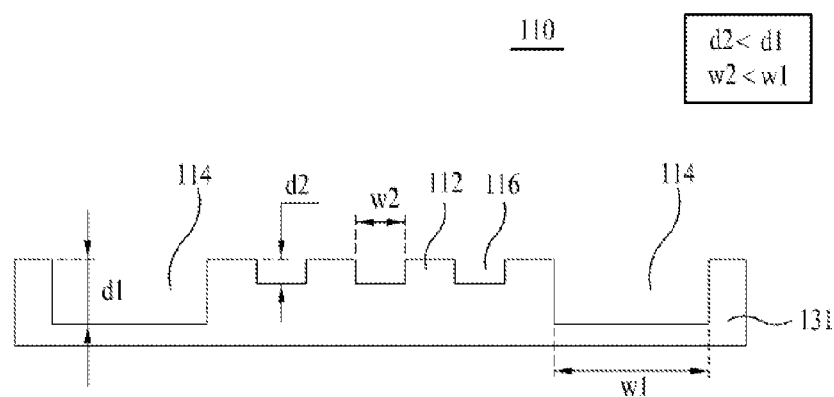
FIG. 3 is a sectional view illustrating the cliché shown in FIG. 2 in detail.

As shown in FIG. 3, the cliché 110 has a long groove pattern 114, a short groove pattern 116, and a protrusion pattern 112 so as to form first and second thin film patterns having line widths different from each other on the substrate 101.

The protrusion pattern 112 refers to a region coming into contact with the printing liquid applied to the blanket when the printing roller 120 rotates on the cliché 110. Thus, when the printing roller 120 rotates on the cliché 110, the printing liquid of the blanket is transferred onto the protrusion pattern 112.

The long and short groove patterns 114 and 116 refer to respective regions which do not come into contact with the printing liquid applied to the blanket of the printing roller 120 when the printing roller 120 rotates on the cliché 110. Thus, the printing liquid of the blanket corresponding to the long and short groove patterns 114 and 116 remains at the blanket of the printing roller 120 so as to be formed as the thin film pattern on the substrate 101.

The long groove pattern 114 corresponds to the first thin film pattern, to be formed on the substrate 101, having a relatively great line width. Accordingly, the long groove pattern 114 is formed to have a first line width w1 and a first depth d1 of several dozen μm.

The short groove pattern 116 corresponds to the second thin film pattern, to be formed on the substrate 101, having a line width smaller than the first thin film pattern. Accordingly, the short groove pattern 116 is formed to have a second line width w2 smaller than the first line width w1 and a second depth d2 of several μm lower than the first depth d1.

The depth d1 of the long groove pattern 114 is formed deeper than the depth d2 of the short groove pattern 116, so that the printing roller 120 may be prevented from touching a bottom surface of the long groove pattern 114 during contact between the printing roller 120 and the cliché 110.

FIGS. 4A to 4H are sectional views for explaining a method of fabricating the cliché shown in FIG. 3.

Figure 4A:
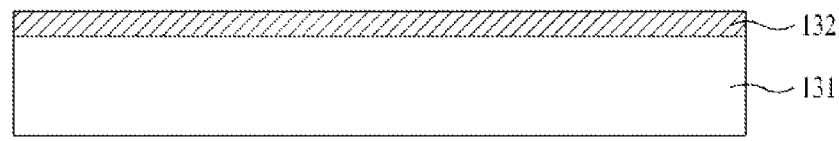
FIGS. 4A to 4H are sectional views for explaining a method of fabricating the cliché shown in FIG. 3.

As shown in FIG. 4A, a first mask thin film layer 132 is formed on a base substrate 131. The first mask thin film layer 132 has a single layer structure made of any one of CrOx, CrNx, Cr, or a multilayer structure including the same. For example, the first mask thin film layer 132 has a structure in which CrOx/CrNx/Cr are laminated in this order.

Figure 4B:
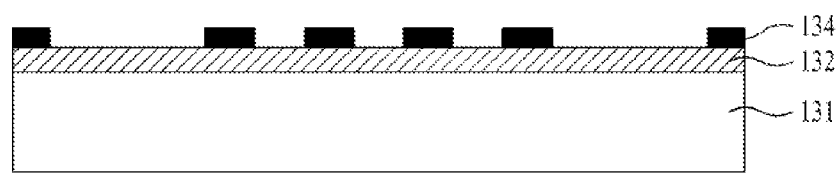
Figure 4C:
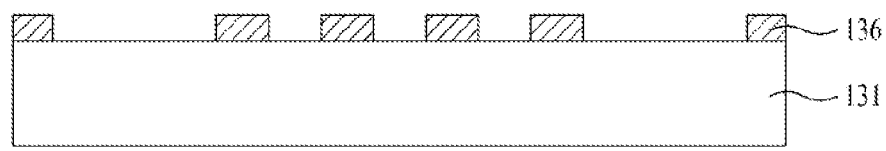

Next, a photoresist is coated over the base substrate 131, at which the first mask thin film layer 132 is formed, and is then patterned by a photolithographic process including an exposure process and a developing process, such that a first photoresist pattern 134 is formed as shown in FIG. 4B. The first mask thin film layer 132 is patterned through an etching process using the first photoresist pattern 134, and thus a first mask thin film pattern 136 is formed as shown in FIG. 4C. The first photoresist pattern 134 on the first mask thin film pattern 136 is removed through a stripping process.

Figure 4D:
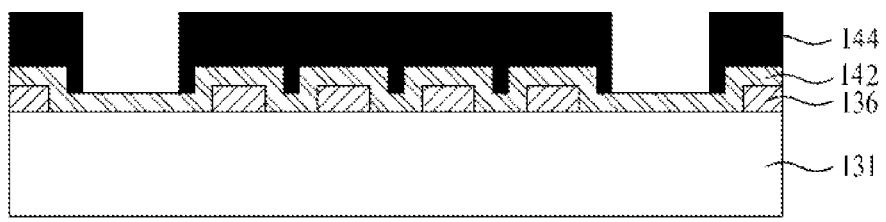

Subsequently, a second mask thin film layer 142 is formed on the base substrate 131 at which the first mask thin film pattern 136 is formed, as shown in FIG. 4D. The second mask thin film layer 142 has a single layer structure made of any one of Mo, Al, AlNd, or a multilayer structure including the same. The second mask thin film layer 142 formed of the above-described materials dose not react with an etchant used during a wet etching process of the base substrate 131 to be performed later. A photoresist is coated over the base substrate 131 at which the second mask thin film layer 142 is formed, and is then patterned by the photolithographic process including the exposure process and the developing process, such that a second photoresist pattern 144 is formed.

Figure 4E:
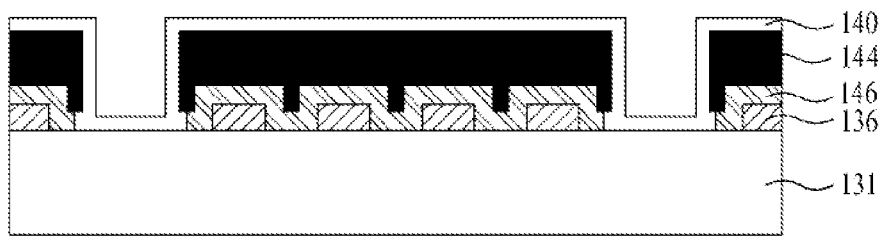

The second mask thin film layer 142 is patterned through the etching process using the second photoresist pattern 144, and thus a second mask thin film pattern 146 is formed as shown in FIG. 4E. Subsequently, a resistant reinforcement inducing layer 140 is entirely formed on the base substrate 131 at which the second mask thin film pattern 146 is formed. The resistant reinforcement inducing layer 140 is formed in such a manner that a transparent conductive film 140 including at least one of indium tin oxide (ITO), indium zinc oxide (IZO), and indium tin zinc oxide (ITZO) is formed through a deposition method such as sputtering at room temperature. Meanwhile, a cleaning process may also be executed to minimize contamination of sputtering equipment before formation of the resistant reinforcement inducing layer 140.

Energy including heat and the like generated during a deposition process of the resistant reinforcement inducing layer 140 is introduced into the second photoresist pattern 144 under the resistant reinforcement inducing layer 140. By virtue of a strong chemical bond within the second photoresist pattern 144 due to the introduced energy, the second photoresist pattern 144 has acid resistance to etchant used during the etching process of the base substrate 131 later. Also, the resistant reinforcement inducing layer 140 serves to reinforce the second photoresist pattern 144 having weaker strength than the transparent conductive film which is a material of the resistant reinforcement inducing layer 140.

Figure 4F:
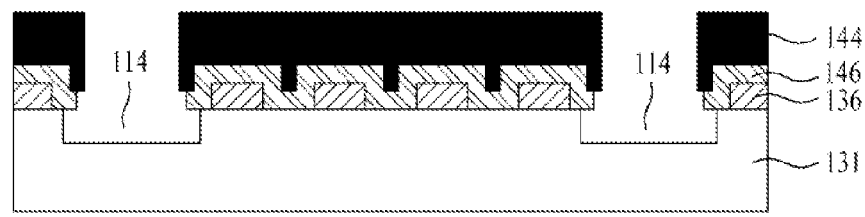

Thereafter, as shown in FIG. 4F, the resistant reinforcement inducing layer 140 is removed and at the same time the base substrate 131 is primarily etched to a depth of several dozen μm, through the etching process using the second mask thin film pattern 146 and second photoresist pattern 144 as masks. The base substrate 131 is primarily etched for 300 minutes to 500 minutes through a wet etching process using hydrogen fluoride (HF)-based etchant having a concentration of 2-25 wt %, and thus the long groove pattern 114 having the first line width w1 is formed. During the wet etching process, the resistant reinforcement inducing layer 140 is removed and the second photoresist pattern 144 located under the resistant reinforcement inducing layer 140 has acid resistance to the hydrogen fluoride (HF)-based etchant, thereby preventing the hydrogen fluoride (HF)-based etchant from penetrating into the second photoresist pattern 144. Thus, it may be possible to prevent fluoride ions of the etchant from diffusing into the second photoresist pattern 144 and to prevent fine cracks from being generated in the second photoresist pattern 144 due to non-uniform stress. In addition, it may be possible to prevent the fluoride ions from penetrating into a portion of poor step coverage, namely, between the base substrate 131 and the first mask thin film pattern 136, which are covered by the second mask thin film pattern 146, along the fine cracks. Consequently, pinholes may be prevented from being formed at an undesired region of the base substrate 131. In addition, the second mask thin film pattern 146 is used as the mask with the second photo resist pattern 144 during the primarily etching process of the base substrate 131. In other words, the second mask thin film pattern 146 dose not react with the etchant used in the primarily etching process of base substrate 131, even if the etchant comes into contact with the second mask thin film pattern 146 due to a damage of the second photo resist pattern 144 cased by the primarily etching process for the 300 minutes to 500 minutes. Thus, the present invention may prevent the damages of the base substrate 131 and the first mask thin film pattern 136, which are covered by the second mask thin film pattern 146. Thereafter, the second photoresist pattern 144 is removed through a stripping process, and the second mask thin film pattern 146 is removed through dry etching process.

Figure 4G:
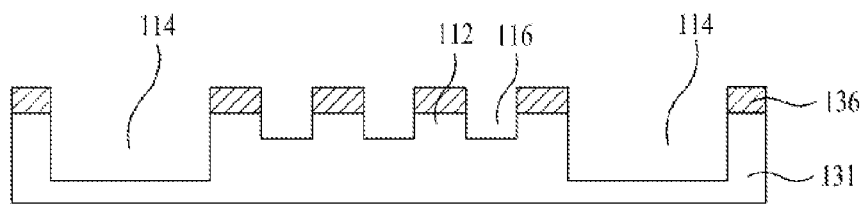

Thereafter, as shown in FIG. 4G, the base substrate 131 is secondarily etched to a depth of several μm through the etching process using the first mask thin film pattern 136 as a mask. In this case, the base substrate 131 is etched through the wet etching process using the HF-based etchant having the concentration of 2-25 wt %. Thus, the base substrate 131 is etched to be exposed to gaps formed at the first mask thin film pattern 136 so as to form the short groove pattern 116. The long groove pattern 114 is formed to have a depth deeper than the short groove pattern 116 by etching twice.

Figure 4H:
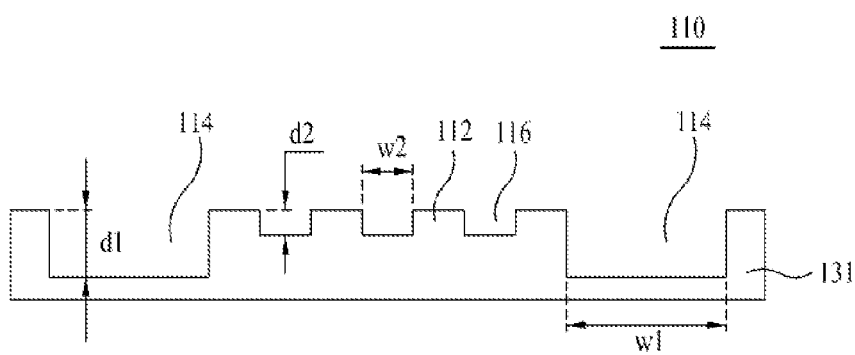

Subsequently, the cliché 110 is completed by removal of the first mask thin film pattern 136 remaining on the base substrate 131 through the etching process, as shown in FIG. 4H.

FIGS. 5A to 5D are sectional views for explaining a method of fabricating the thin film pattern according to the illustrated embodiment of the present invention.

Figure 5A:
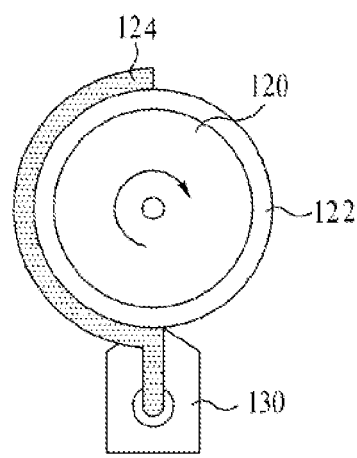
FIGS. 5A to 5D are sectional views for explaining a method of fabricating a thin film pattern using the cliché shown in FIG. 3.
Figure 5B:
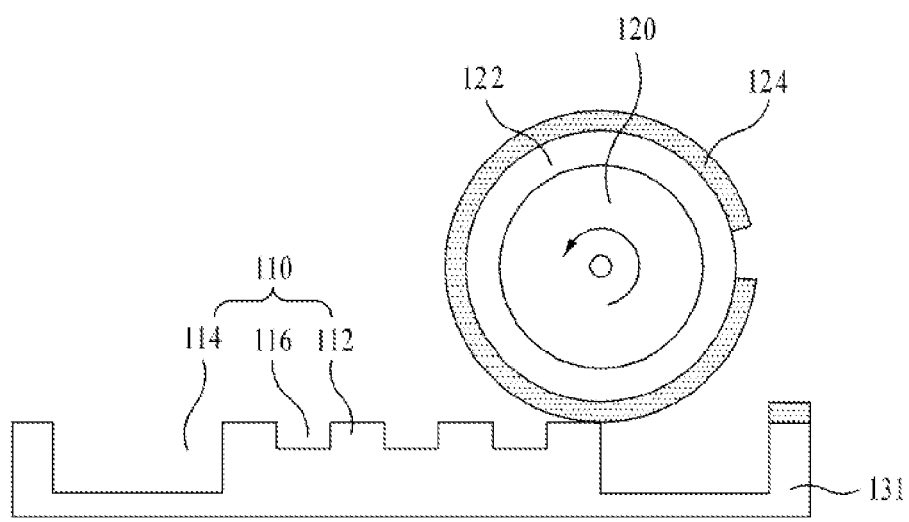

As shown in FIG. 5A, the printing roller 120, to which the blanket 122 is attached, is provided. The printing liquid 124 is applied to the blanket 122 through the printing liquid supply portion 130. Subsequently, the printing roller 120, to which the printing liquid 124 is applied, rotates on the cliché 110 having the short groove, long groove, and protrusion patterns 116, 114, and 112, as shown in FIG. 5B. The printing liquid 124 at the region coming into contact with the protrusion pattern 112 is transferred onto the protrusion pattern 112. The printing liquid 124 at the respective regions which do not come into contact with the short and long groove patterns 116 and 114 remains at the surface of the blanket 122 so as to be formed as the first and second thin film patterns 124a and 124b.

Figure 5C:
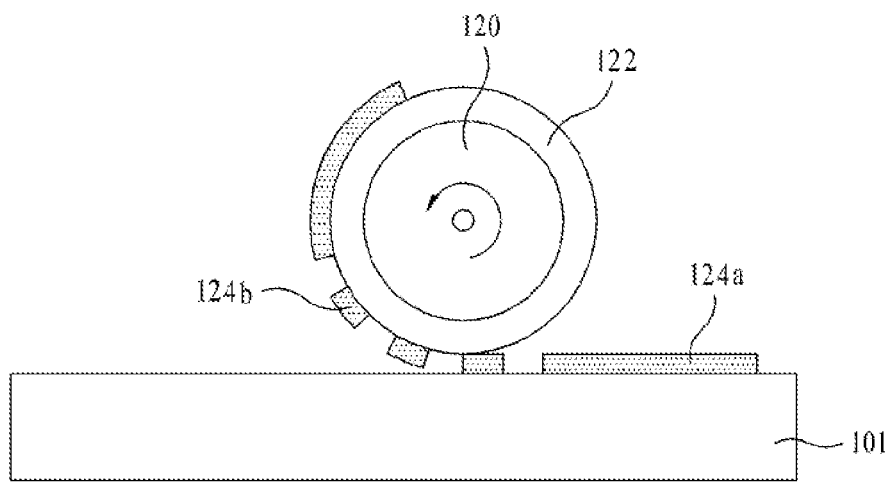
Figure 5D:
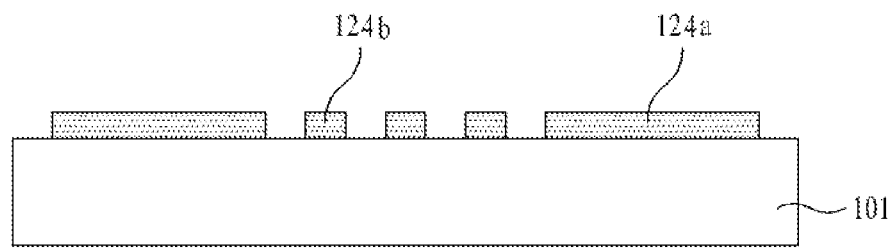

As shown in FIG. 5C, the printing roller 120, at which the first and second thin film patterns 124a and 124b are formed, rotates on the substrate 101. Thus, the first and second thin film patterns 124a and 124b transferred onto the substrate 101 are dried and hardened.

For example, the first thin film pattern 124a is used as an outside black matrix located at an outside region enclosing an active region of a Liquid Crystal Display (LCD) panel, whereas the second thin film pattern 124b having the line width smaller than the first thin film pattern 124a is used as a black matrix located at the active region of the LCD panel.

In addition to the above-mentioned example, the first and second thin film patterns 124a and 124b according to the illustrated embodiment of the present invention may be used as a thin or thick film of a Flat Panel Display (FPD) device such as a Plasma Display Panel (PDP), an Electro-Luminescent (EL) display panel, a Field Emission Display (FED) device or the like as well as the LCD panel.

Figure 6:
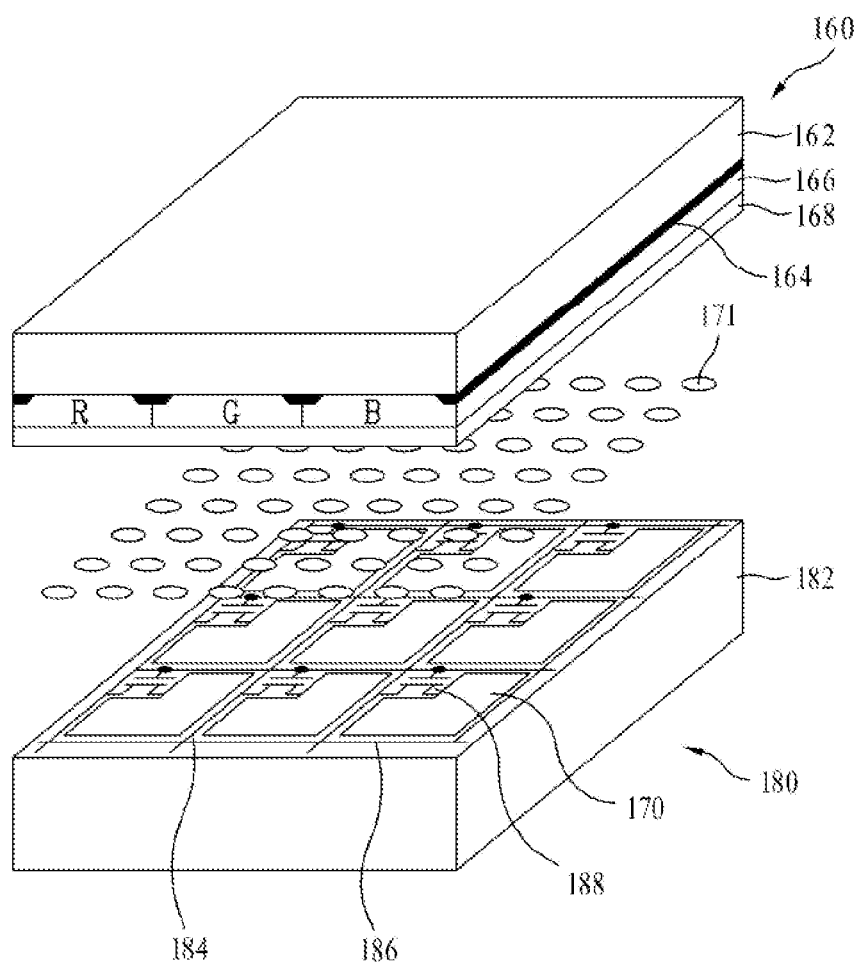
FIG. 6 is a perspective view illustrating a liquid crystal display panel having the thin film pattern formed by the fabrication method shown in FIGS. 5A to 5D.

In detail, the LCD panel, shown in FIG. 6, according to the illustrated embodiment of the present invention includes a thin film transistor substrate 180 and a color filter substrate 160, which face and are bonded to each other while interposing a liquid crystal layer 171 therebetween.

The color filter substrate 160 includes a black matrix 164, a color filter 166, a common electrode 168, and a column spacer (not shown), which are formed on an outer substrate 162 in this order.

The thin film transistor substrate 180 includes gate lines 186 and data lines 184 formed to intersect with each other on a lower substrate 182, Thin Film Transistors (TFTs) 188 respectively formed adjacent to portions at which the respective gate lines 186 and the respective data lines 184 intersect, and pixel electrodes 170 formed at respective pixel regions arranged in the form of an intersecting structure of the gate and data lines 186 and 184.

The printing process according to the illustrated embodiment of the present invention may form a thin film pattern, which is formed of an organic substance, such as an organic thin film layer including the color filter 166, the black matrix 164, and the column spacer of the LCD panel and a luminescent layer of an organic Electro-Luminescent (EL) device, and an organic pattern used as a mask to pattern a thin film, which is formed of an inorganic substance, such as the TFTs, the gate lines 186, the data lines 184, and the pixel electrodes 170 of each of the LCD panel and the organic EL device.

Figure 7:
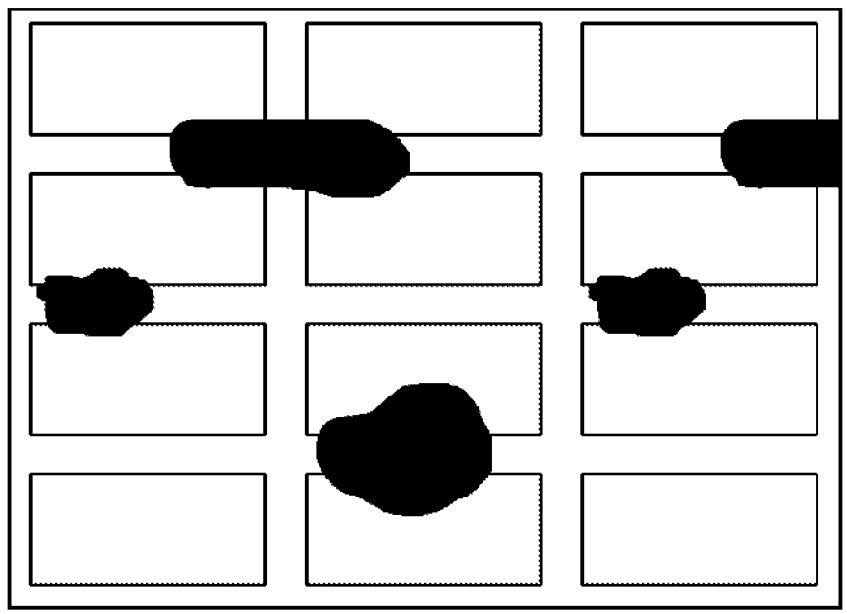
FIG. 7 is views for explaining thin film patterns formed by the clichés according to the related art and the illustrated embodiment of the present invention, respectively.
Figure 7:
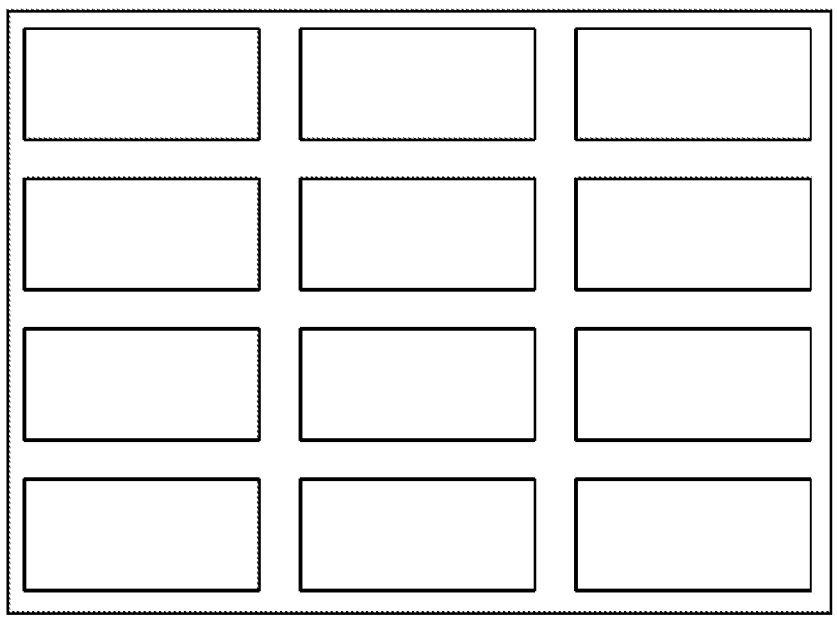

As described above, in accordance with the cliché according to the illustrated embodiment of the present invention, it may be possible to prevent the printing roller from touching the bottom surface of the cliché, and to prevent the etchant from penetrating into the photoresist pattern during the etching process by etching the base substrate after reinforcing acid resistance of the photoresist pattern to the etchant using the resistant reinforcement inducing layer. Consequently, pinholes may be prevented from being formed at the undesired region of the cliché. Accordingly, the present invention may fabricate a zero-defect cliché, thereby enabling prevention of faults caused at the same positions of the conventional substrate, as shown in FIG. 7.

As is apparent from the above description, in accordance with a method of fabricating a cliché according to the present invention, a long groove pattern of the cliché corresponding to a thin film pattern having a great line width is formed deeper than a short groove pattern of the cliché corresponding to a thin film pattern having a small line width. Thus, the present invention may prevent a printing roller from touching a bottom surface of the cliché. Also, the present invention may prevent the etchant from penetrating into a photoresist pattern during an etching process by etching a base substrate after reinforcing acid resistance of the photoresist pattern to the etchant using a resistant reinforcement inducing layer. Consequently, the present invention may prevent pinholes from being formed at an undesired region of the cliché. In addition, the present invention may prevent faults caused at the same positions of the cliché, thereby achieving improvement in yield.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of fabricating a cliché comprising:
   forming a first mask thin film layer on a base substrate;
   forming a first photoresist pattern on the base substrate at which the first mask thin film layer is formed;
   patterning the first mask thin film layer using the first photoresist pattern as a mask to form a first mask thin film pattern;
   forming a second mask thin film layer on the base substrate at which the first mask thin film pattern is formed;
   forming a second photoresist pattern on the second mask thin film layer;
   patterning the second mask thin film layer using the second photoresist pattern as a mask to form a second mask thin film pattern;
   forming a resistant reinforcement inducing layer to cover the second photoresist pattern, thereby transforming the second photoresist pattern into a resistant reinforced photoresist pattern; and
   forming groove patterns having different depths from each other by etching the base substrate using the resistant reinforced photoresist pattern and the first and second mask thin film patterns as masks.

2. The method of fabricating the cliché according to claim 1, wherein the resistant reinforcement inducing layer is formed through a deposition process at room temperature and the resistant reinforcement inducing layer is formed of a transparent conductive film including at least one of indium tin oxide (ITO), indium zinc oxide (IZO), and indium tin zinc oxide (ITZO).

3. The method of fabricating the cliché according to claim 2, wherein the forming the resistant reinforcement inducing layer includes introducing an energy generated during the deposition process of the resistant reinforcement inducing layer into the second photoresist pattern under the resistant reinforcement inducing layer.

4. The method of fabricating the cliché according to claim 1, wherein the resistant reinforcement inducing layer is formed on the second photoresist pattern and the base substrate exposed by the second photoresist pattern.

5. The method of fabricating the cliché according to claim, wherein:
   the resistant reinforced second photoresist pattern has acid resistance to a etchant of the base substrate; and
   the etchant of the base substrate includes hydrogen fluoride (HF).

6. The method of fabricating the cliché according to claim 1, wherein the forming the groove patterns having the different depths from each other comprises:
   primarily wet etching the base substrate using the second photoresist pattern and the first and second mask thin film patterns as masks, thereby forming a long groove pattern and removing the resistant reinforcement inducing layer by the primary wet etching;
   removing the second photoresist pattern and the second mask thin film pattern;
   secondarily wet etching the base substrate using the first mask thin film pattern as a mask, thereby forming a short groove pattern and allowing the long groove pattern to have a depth deeper than the short groove pattern; and
   removing the first mask thin film pattern.

\* \* \* \* \*